US006833512B2

(12) United States Patent
Liu

(10) Patent No.: US 6,833,512 B2
(45) Date of Patent: Dec. 21, 2004

(54) SUBSTRATE BOARD STRUCTURE

(75) Inventor: Sheng-Tsung Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 35 days.

(21) Appl. No.: 10/128,718

(22) Filed: Apr. 23, 2002

(65) Prior Publication Data

US 2003/0136582 A1 Jul. 24, 2003

(30) Foreign Application Priority Data

Jan. 18, 2002 (TW) ....................................... 91100721 A

(51) Int. Cl.[7] ........................... H01R 12/04; H05K 1/11

(52) U.S. Cl. ....................................... 174/262; 174/260

(58) Field of Search ................................ 174/254–266; 361/780–784, 760–761, 767; 428/209–210

(56) References Cited

U.S. PATENT DOCUMENTS 6,023,211 A * 2/2000 Somei ........................ 333/246
6,172,305 B1 * 1/2001 Tanahashi .................. 174/255
6,201,194 B1 * 3/2001 Lauffer et al. ............. 174/264
6,303,881 B1 * 10/2001 Parker et al. .............. 174/264
6,329,604 B1 * 12/2001 Koya ......................... 174/255
6,377,464 B1 * 4/2002 Hashemi et al. ............ 361/760
6,413,620 B1 * 7/2002 Kimura et al. .............. 428/210

* cited by examiner

*Primary Examiner*—David Zarneke
*Assistant Examiner*—Tuan Dinh
(74) *Attorney, Agent, or Firm*—J.C. Patents

(57) ABSTRACT

A substrate board structure having a core layer, a metallic layer and a connecting metallic layer. The core layer has a first surface and a second surface. The metallic layer includes a contact pad and a circuit line. The contact pad and the circuit line are separately lain on the first surface of the core layer. The connecting metallic layer is formed on the second surface of the core layer. The connecting metallic layer is electrically connected to both the contact pad and the circuit line.

6 Claims, 4 Drawing Sheets

SUBSTRATE BOARD STRUCTURE

CROSS-REFERENCE TO RELATED APPLICATION

This application claims the priority benefit of Taiwan application serial no. 91100721, filed Jan. 18, 2002.

BACKGROUND OF THE INVENTION

1. Field of Invention

The present invention relates to a substrate board structure. More particularly, the present invention relates to a substrate board structure that has a high bonding quality.

2. Description of Related Art

In this information networking age, many electronic products have become indispensable working tools for conducting some of our daily activities. In general, a silicon chip is at the core of most of our electronic products. The chip is electronically connected to other chips or passive devices through a substrate board. The chip and the substrate board are electrically connected together through a lead frame. Typically, the lead frame and the substrate board are bonded together using surface mount technology (SMT). Passive devices may be attached to a chip using surface mount technology as well. However, some of the solder paste may bleed out during an SMT operation.

FIG. 1 is magnified top view showing a contact region on a conventional substrate board. FIG. 2 is a cross-sectional view along line I—I of the substrate board in FIG. 1. The substrate board 100 is a composite layer comprising a metallic layer 110, a core layer 120, a first solder mask layer 130 and a second solder mask layer 140. The core layer 120 may also be a composite layer comprising a plurality of alternately stacked patterned circuit layers (not shown) and insulation layers (not shown). The core layer 120 further has a first surface 122 and a corresponding second surface 124. The superficial layer just below the first surface 122 is an insulation layer. The metallic layer 110 is formed over the first surface 122 of the core layer 120. The metallic layer 110 includes at least a contact pad 112 and at least a circuit line 114. The contact pad 112 and the circuit line 114 are formed together in a single step. The contact pad 112 has a rectangular outline. The metallic layer 110 can be a copper layer. The first solder mask layer 130 is formed over the metallic layer 110 and the first surface 122 of the core layer 120. The first solder mask layer 130 has an opening 132 that exposes the contact pad 112, a portion of the circuit line 114 close to the contact pad 112 and the first surface 122 of the core layer 120 close to the contact pad 112. The second solder mask layer 140 is formed on the second surface 124 of the core layer 120.

To prepare for a surface mount operation, a solder paste 150 is coated over the central area of the contact pad 112. The contact pad on an electronic device (not shown) is flipped over to make contact with the solder paste 150. A reflow process is next conducted inside an oven (not shown) so that the contact pad on the electronic device and the contact pad 112 are bonded together through the melted solder paste 150. Since surface tension between the solder paste 150 and the copper layer is small, a portion of the solder paste material 150 may disperse along circuit line 114 direction rather than converging on the contact pad 112. Some of the solder paste material may even flow to the first surface 122 of the core layer 120 and lead to unwanted electrical interference and surface contamination. Thus, bonding quality of the surface mounted package is frequently compromised.

SUMMARY OF THE INVENTION

Accordingly, one object of the present invention is to provide a substrate board structure capable of improving bonding quality between the substrate board and an electronic device.

A second object of this invention is to provide a substrate board structure capable of eliminating as much interference and contamination due to bonding as possible.

To achieve these and other advantages and in accordance with the purpose of the invention, as embodied and broadly described herein, the invention provides a substrate board. The substrate board comprises a core layer, a metallic layer, a connective metallic layer, a first metal plug and a second metal plug. The core layer is an insulation layer having a first surface and a second surface. The core layer further has at least a first opening and at least a second opening. Both the first opening and the second opening run through the core layer. The metallic layer is formed over the first surface of the core layer. The metallic layer includes at least a contact pad and at least a circuit line. The contact pad and the circuit line are separately lain on the first surface of the core layer. The contact pad has a first through-hole while the circuit line has a second through hole. The first through hole of the contact pad and the first opening in the core layer are connected. The second through hole in the circuit line and the second opening in the core layer are also connected. The connective metallic layer is formed over the second surface of the core layer. The connective metallic layer has a third through hole and a fourth through hole. The third through hole in the connective metallic layer and the first opening in the core layer are connected. The fourth through hole in the connective metallic layer and the second opening in the core layer are connected. The first metal plug fills the first through hole, the first opening and the third through hole so that the contact pad and the connective metallic layer are electrically connected. Similarly, the second metal plug fills the second through hole, the second opening and the fourth through hole so that the circuit line and the connective metallic layer are electrically connected.

According to one preferred embodiment of this invention, the core layer can be a composite layer having a plurality of alternately stacked insulation layers and patterned circuit line layers. In addition, the contact pad may have a rectangular shape or circular shape. The first through hole may be positioned in a middle or peripheral section of the contact pad. The second through hole may be positioned at a terminal region or a middle section of the circuit line.

This invention also provides an alternative substrate board structure. The substrate board comprises a core layer, a metallic layer on the surface of the core layer and a connective metallic layer. The metallic layer includes at least a contact pad and at least a circuit line. The contact pad and the circuit line are separately lain over the first surface of the core layer. The connective metallic layer is enclosed within the core layer such that the connective metallic layer connects electrically with both the contact pad and the circuit line.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
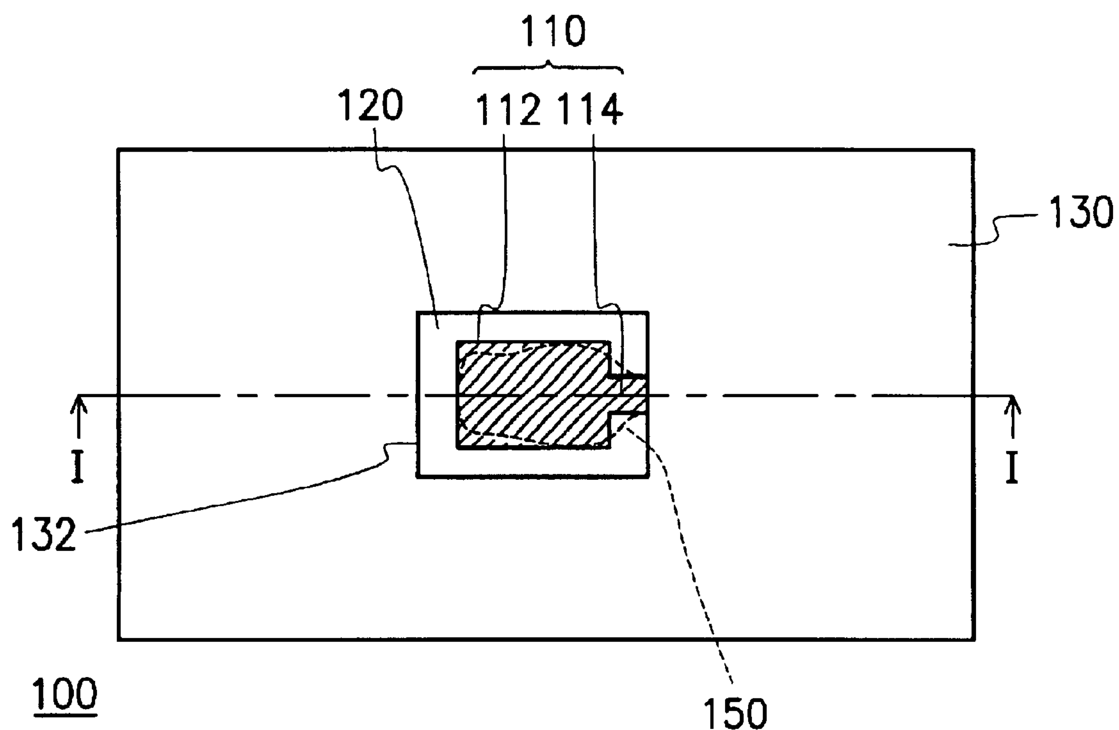
FIG. 1 is magnified top view showing a contact region on a conventional substrate board.
Figure 2:
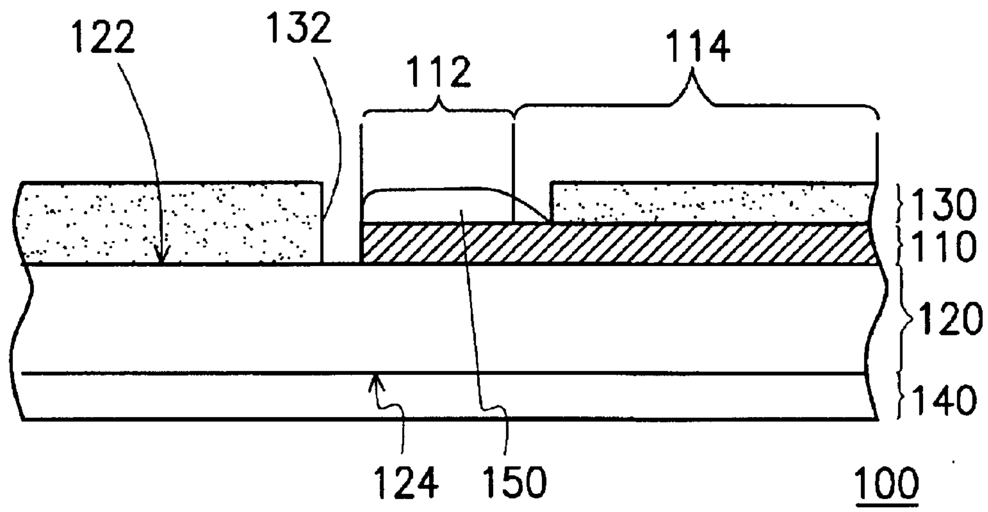
FIG. 2 is a cross-sectional view along line I—I of the substrate board in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
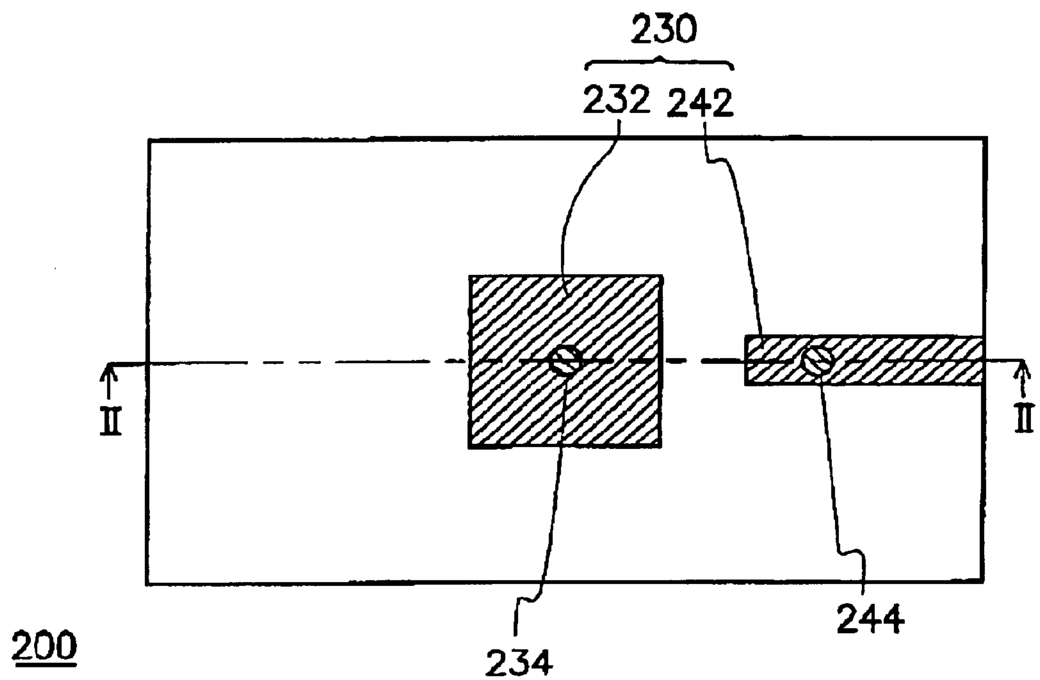
FIG. 3 is a magnified top view showing a contact region on a substrate board fabricated according to a first preferred embodiment of this invention.
Figure 4:
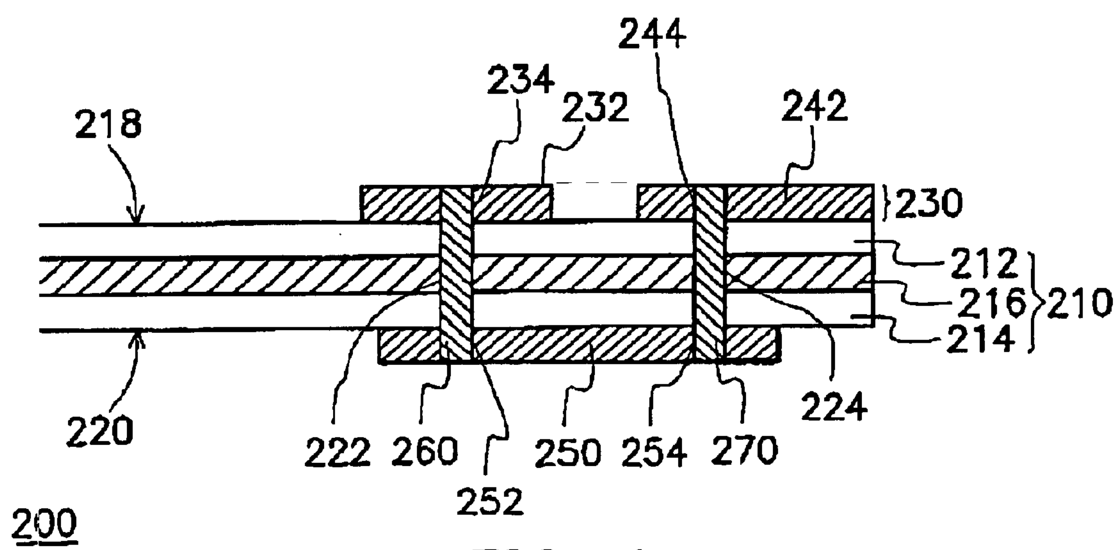
FIG. 4 is a cross-sectional view along line II—II of the substrate board in FIG. 3.

FIG. 3 is a magnified top view showing a contact region on a substrate board fabricated according to a first preferred embodiment of this invention. FIG. 4 is a cross-sectional view along line II—II of the substrate board in FIG. 3. As shown in FIGS. 3 and 4, the substrate 200 comprises a core layer 210, a metallic layer 230, a connective metallic layer 250, a first metal plug 260 and a second metal plug 270. The core layer 210 is a composite layer having a patterned circuit layer 216 sandwiched between a pair of insulation layers 212 and 214. The core layer 210 has a first surface 218, a second surface 220, at least one first opening 222 and at least one second opening 224. The first opening 222 and the second opening 224 pass through the core layer 210. The metallic layer 230 is on the first surface 218 of the core layer 210. The metallic layer 230 includes at least one contact pad 232 and at least one circuit line 242. The contact pad 232 and the circuit line 242 are separately lain on the first surface 218 of the core layer 210. The contact pad 232 has a first through hole 234 in connection with the first opening 222. The first through hole 234 is in the central region of the contact pad 232. The contact pad 232 has a rectangular or square shape. The circuit line 242 has a second through hole 244 in connection with the second opening 224. The second through hole 244 is at the terminal region of the circuit line 242. The connecting metallic layer 250 is on the second surface 220 of the core layer 210. The connecting metallic layer 250 has a third through hole 252 and a fourth through hole 254. The third through hole 252 and the first opening 222 are connected and the fourth through hole 254 and the second opening 224 are similarly connected. The first metal plug 260 fills the first through hole 234, the first opening 222 and the third through hole 252 so that the contact pad 232 and the connecting metallic layer 250 are electrically connected. Similarly, the second metal plug 270 fills the second through hole 244, the second opening 2224 and the fourth through hole 254 so that the circuit line 242 and the connecting metallic layer 250 are electrically connected. The contact pad 232, the circuit line 242, the connecting metallic layer 250, the first metal plug 260 and the second metal plug 270 are all made from copper material, for example.

During a reflow operation, solder paste can hardly migrate in the directly of the circuit line 242 since the contact pad 232 and the circuit line 242 are formed in separate locations. The solder paste mainly collects over the contact pad 232, thereby preventing any unwanted contamination by the solder paste in non-bonding locations that may interfere with normal operation. Sometimes, due to package thickness or cost considerations, no solder mask layer is formed over the substrate board 200 so that the circuit line 242 is directly exposed. If the substrate board 200 is designed to have the aforementioned structural formation like the contact pad 232 and the circuit line 242, the solder paste may congregate over the contact pad 232 and prevent any dispersion. Without solder paste dispersion, unwanted electrical connection and short circuit is avoided. Hence, this invention provides a bonding technique that produces products having greater reliability.

Figure 5:
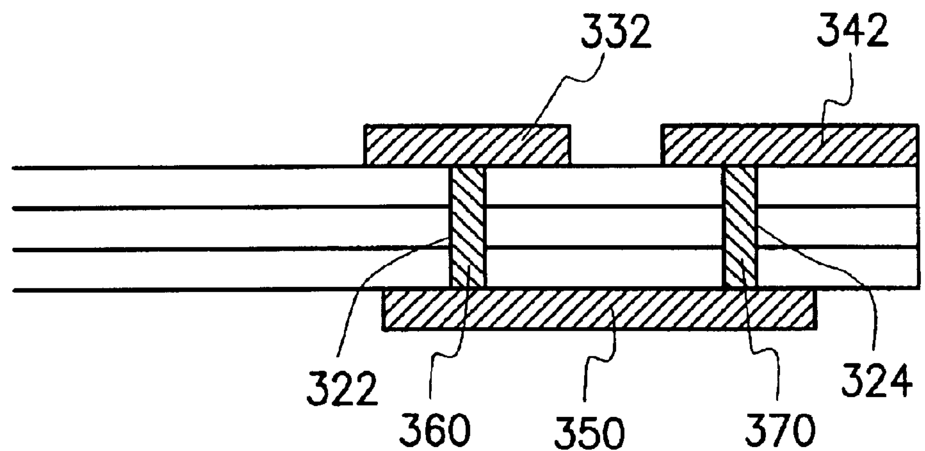
FIG. 5 is a magnified cross-sectional view showing a contact region on a substrate board fabricated according to a second preferred embodiment of this invention.

In the first embodiment, the contact pad has a first through hole, the circuit line has a second through hole and the connecting metallic layer has a third and a fourth through hole. However, this configuration is not the only structural arrangement. FIG. 5 is a magnified cross-sectional view showing a contact region on a substrate board fabricated according to a second preferred embodiment of this invention. As shown in FIG. 5, none of the contact pad 332, the circuit line 342 and the connecting metallic layer 350 has any through holes. The first metal plug 360 inside the first opening 322 directly contacts the surface of the contact pad 332 and the connecting metallic layer 350. Similarly, the second metal plug 370 inside the second opening 324 directly contacts the surface of the circuit line 342 and the connecting metallic pad 350.

Figure 6:
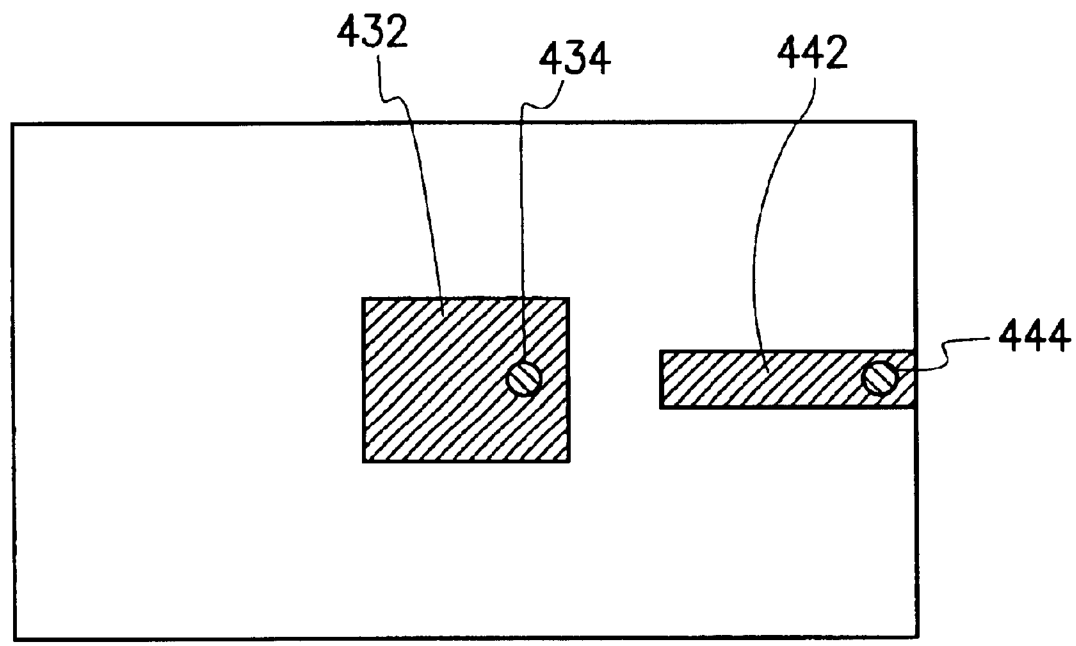
FIG. 6 is a magnified top view showing a contact region on a substrate board fabricated according to a third preferred embodiment of this invention.

In addition, in the aforementioned embodiments, the first through hole is formed in the middle of the contact pad area and the second through hole is formed at the terminal area of the circuit line. However, these locations are not the only places for forming the first and the second through hole. FIG. 6 is a magnified top view showing a contact region on a substrate board fabricated according to a third preferred embodiment of this invention. As shown in FIG. 6, the first through hole 434 is formed near the edge of the contact pad 432 and the second through hole 444 is formed near the central area of the circuit line 442.

Figure 7:
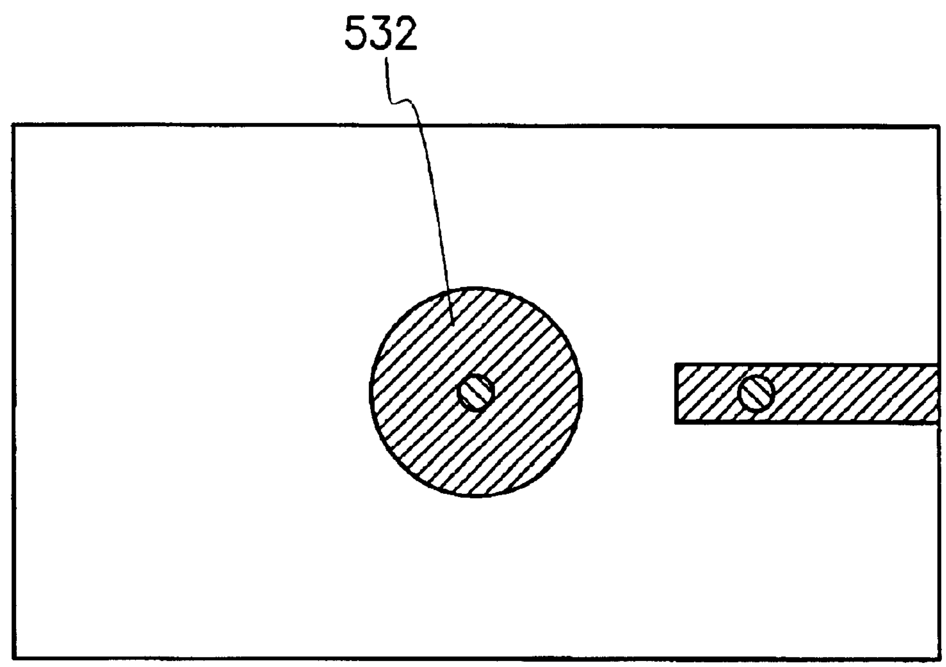
FIG. 7 is magnified top view showing a contact region on a substrate board fabricated according to a fourth preferred embodiment of this invention.

In the aforementioned embodiments, the contact pad has a rectangular or square shape. However, other shapes are also possible. FIG. 7 is magnified top view showing a contact region on a substrate board fabricated according to a fourth preferred embodiment of this invention. As shown in FIG. 7, the contact pad 532 has a circular shape. Obviously, other geometric shapes such as polygonal and elliptical shape are also possible.

Figure 8:
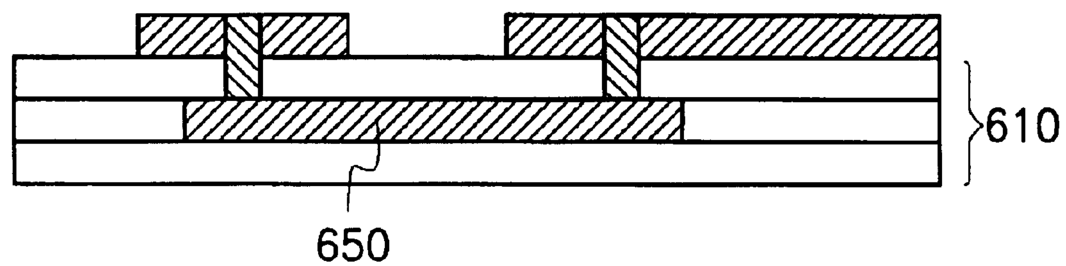
FIG. 8 is a magnified cross-sectional view showing a contact region on a substrate board fabricated according to a fifth preferred embodiment of this invention.

Finally, in all the aforementioned embodiments, the connecting metallic layer lies on the second surface entirely outside the core layer. However, the connecting metallic layer may be embedded. FIG. 8 is a magnified cross-sectional view showing a contact region on a substrate board fabricated according to a fifth preferred embodiment of this invention. As shown in FIG. 8, the connective metallic layer 650 is embedded within the core layer 610.

In conclusion, major advantages of this invention at least includes:

1. Since the contact pad and the circuit line are separately lain on the substrate board, no solder paste will only collect over the contact pad during a reflow operation. Thus, bonding quality is improved.
2. A solder mask layer on the substrate board is not always necessary so that the circuit line may be directly exposed. Since the contact pad and the circuit line are separately lain, solder paste only collect over the contact pad rather than dispersing to other locations to form a short-circuiting bridge. Consequently, reliability of solder bonds is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A substrate board, comprising:

at least one core layer having a first surface, a second surface, a first opening and a second opening, both the first opening and the second opening passing through the core layer;

a metallic layer on the first surface of the core layer, the matallic layer including a contact pad and a circuit line, the contact pad and the circuit line separately lain on the first surface of the core layer, wherein a solder paste is disposed on the contact pad;

a connecting metallic layer on the second surface of the core layer;

a first metal plug inside the first opening, one end of the first metal plug connected with the contact pad, the other end of the first metal plug connected with the connecting metallic layer; and a second metal plug inside the second opening, one end of the second metal plug connected with the circuit line, the other end of the second metal plug connected with the connecting metallic layer.

2. The substrate board of claim 1, wherein the contact pad has a rectangular or square shape.

3. The substrate board of claim 1, wherein the position where the first metal plug is connected with the contact pad is close to a center of the contact pad.

4. An electronics device package, comprising:

a substrate board, comprising:

at least one core layer having a first surface, a second surface, a first opening and a second opening, both the first opening and the second opening passing through the core layer;

a metallic layer on the first surface of the core layer, the metallic layer including a contact pad and a circuit line, the contact pad and the circuit line separately lain on the first surface of the core layer, wherein a solder paste is disposed on the contact pad;

a connecting metallic layer on the second surface of the core layer;

a first metal plug inside the first opening, one end of the first metal plug connected with the contact pad, the other end of the first metal plug connected with the connecting metallic layer;

a second metal plug inside the second opening, one end of the second metal plug connected with the circuit line, the other end of the second metal plug connected with the connecting metallic layer; and an electronics device mounting on the contact pad through the solder paste and electrically connecting with the circuit line through the first metal plug and the second metal plug.

5. The electronics device package of claim 4, wherein the contact pad has a rectangular or square shape.

6. The electronics device package of claim 4, wherein the position where the first metal plug is connected with the contact pad is close to a center of the contact pad.

* * * * *